United States Patent

[11] 3,567,844

[72] Inventor Ludwig L. Krcmar
Simi, Calif.
[21] Appl. No. 835,567
[22] Filed June 23, 1969
[45] Patented Mar. 2, 1971
[73] Assignee McDonnell Douglas Corporation

[54] TERMINAL PAD FOR PERFORATED CIRCUIT BOARDS AND SUBSTRATES
6 Claims, 4 Drawing Figs.

[52] U.S. Cl. 174/68.5, 29/626, 317/101, 339/17
[51] Int. Cl. H05k 3/32
[50] Field of Search 174/68.5; 317/101 (B), 101 (C), 101 (CC), 101 (CM); 29/625, 626, 490; 339/17, 17 (C)

[56] References Cited

UNITED STATES PATENTS 3,059,152 10/1922 Khouri ........................ 174/68.5X

*Primary Examiner*—Darrell L. Clay
*Attorneys*—Walter J. Jason and Donald L. Royer ABSTRACT: Printed terminal pad structure is formed on a circuit board or substrate surface around and adjacent to the periphery of a terminal pin opening, the pad structure being characterized by a radially extending slot of appropriate width therein to prevent the pin opening from being plugged during a subsequent dip soldering process when a coating of solder is applied to the exposed surface of the pad structure. A solder-coated terminal pad around a solder-free terminal pin opening is thus obtained from the printed terminal pad structure.

INVENTOR.
LUDWIG L. KRCMAR
BY
-AGENT-

TERMINAL PAD FOR PERFORATED CIRCUIT BOARDS AND SUBSTRATES

BACKGROUND OF THE INVENTION

My present invention relates generally to printed circuit boards and thick-film circuit boards or substrates, which are at least partially fabricated with solder-coated terminal pads and leads produced thereon by a solder application process. More particularly, this invention relates to a terminal pad structure or configuration which is useful in the manufacture of solder-coated printed and thick-film circuit boards.

In the fabrication of thick-film circuit boards, for example, a rectangular board or substrate made of a refractory material such as ceramic including 96 percent alumina (aluminum oxide) is usually perforated with a series of small, spaced terminal pin openings located normally along each of three sides, near their respective edges. Terminal pads around these pin openings, and leads interconnecting with the terminal pads and other circuit elements or components are, of course, formed by well-known printed circuit techniques. In these techniques, a prepared photopositive is used to expose an image on a photosensitive printing screen which is then used, after processing, to produce the pads and leads in their designed circuitry pattern from conductive paste rolled through the screen's open areas onto a clean substrate surface. After the substrate circuitry pattern is dried and cured (fired), it is treated by a dip, wave or manual soldering process wherein the printed terminal pads and leads accept a coating of solder thereon. The printed terminal pads and leads are very thin, and the solder coating is needed to enlarge the electrically conducting cross-sectional areas of the pads and leads. The size and strength of the terminal pads and leads are also increased to facilitate their mechanical handling and connection with the other circuit elements and components.

One of the major problems encountered during the fabrication of thick-film circuit boards is the almost unavoidable plugging of the terminal pin openings by the solder in the solder application process for coating the printed terminal pads around such openings. This problem required for its remedy, a very time-consuming secondary operation of "-desoldering" each pin opening individually with the use of a hot-air pencil. This same problem exists in the manufacture of solder-coated printed circuit boards having small terminal pin openings.

SUMMARY OF THE INVENTION

Briefly, and in general terms, my invention is preferably accomplished by providing a printed terminal pad structure or configuration which is formed on a circuit board or substrate surface in a radial area around and adjacent to the periphery of a terminal pin opening, the terminal pad structure or configuration including a radial width or span of printed surface area generally surrounding the opening and characterized by a radially extending slot or gap provided in the circumferential length of the surrounding printed surface area. The radially extending slot or gap has a minimum width (circumferential length) which prevents the terminal pin opening from being plugged during a subsequent dip, wave or manual soldering process wherein a coating of solder is adhered to the exposed surface of the printed terminal pad structure or configuration. A solder-coated terminal pad structure or configuration around a solder-free terminal pin opening is thus obtained from the printed terminal pad structure or configuration.

BRIEF DESCRIPTION OF THE DRAWING

My invention will be more fully understood, and other features and advantages thereof will become apparent, from the description given below of certain exemplary embodiments of the invention. This description of the exemplary embodiments is to be taken in conjunction with the accompanying drawing, in which.

DESCRIPTION OF THE PRESENT EMBODIMENTS

Figure 1:
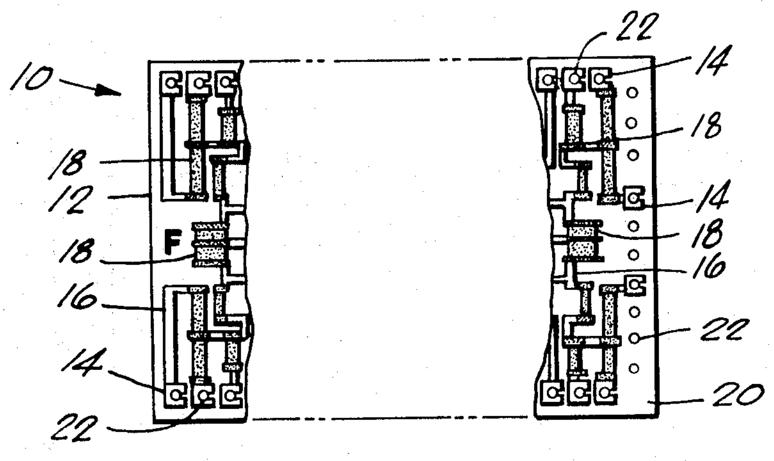
FIG. 1 is a fragmentary, top plan view of a thick-film circuit board or substrate including terminal pads having a structure or configuration in accordance with this invention.

FIG. 1 is a fragmentary, top plan view of a thick-film circuit board 10. The circuit board 10 include a substrate 12, and solder-coated terminal pads 14, solder-coated leads 16 and circuit elements 18 all supported and bonded to the surface 20 of the substrate 12. The circuit elements 18 are, for example, resistors in the form of resistance films formed with ink or paste of appropriate resistivity suitably applied to the substrate surface 20. It can be seen that the ends of the resistors connect with the ends of their corresponding leads 16. The resistive films do not contain metallic particles and solder does not adhere to such films.

The substrate 12 is approximately 1.75 inches long and 1.25 inches wide, for example, and there are 16 terminal pin openings 22 having respective terminal pads 14 positioned along the upper substrate edge and a similar number along the lower substrate edge. There are 10 terminal pin openings 22 located along the right substrate edge; however, only two of these openings 22 have terminal pads 14 provided around them as shown in FIG. 1.

Figure 2:
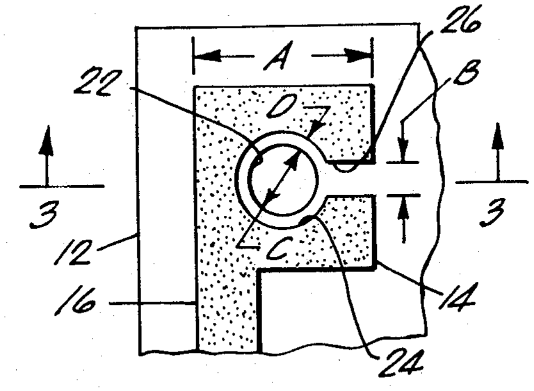
FIG. 2 is a fragmentary and enlarged top plan view of a portion of the substrate of FIG. 1, showing the structure or configuration of a terminal pad thereof.

FIG. 2 is a fragmentary and enlarged top plan view of a portion of the substrate 12 illustrating the structure or configuration of a terminal pad 14 thereon. The pad 14 is, for example, generally square having a side dimension A. The periphery of a central pad opening 24 is located around and adjacent to the periphery of the terminal pin opening 22. A slot or gap 26 of width B is provided in the pad structure as shown. The pin opening 22 has a diameter of dimension C, and the periphery of the pin opening is spaced from the periphery of the pad opening 24 by a spacing of dimension D.

The dimension A is 0.100 inch, dimension B is 0.015 inch, dimension C is 0.020 inch and dimension D is 0.005 inch, for example. The spacing of dimension D is provided to avoid printing paste or ink leakage into the terminal pin openings 22 in the perforated substrate 12. This prevents smearing of the pattern during the screening operation. The terminal pad structure or configuration according to this invention may be preferably used with terminal pin openings 22 having diameters broadly in the range of 0.010 to 0.100 inch, approximately. The slot 26 has a minimum width (B) of approximately 0.015 inch in this range but could be larger. The slot 26 is not needed in terminal pads used around larger diameter terminal pin openings; however, it should be noted that the thickness of the solder coating increases with a larger area or diameter terminal pad and, thus, there is a greater likelihood for solder to bridge the slot or gap during the solder application process. When this does occur, the resultant even surface tension of the hot solder and the associated capillary action act to cause closing and plugging of the terminal pin opening.

While certain specific types of materials and dimensions have been mentioned above, it is to be noted that such specific data is merely illustrative of the terminal pad structure and is given by way of example only. It is to be understood that any such specific data provided herein is not to be construed as limiting on my invention in any manner.

Figure 3:
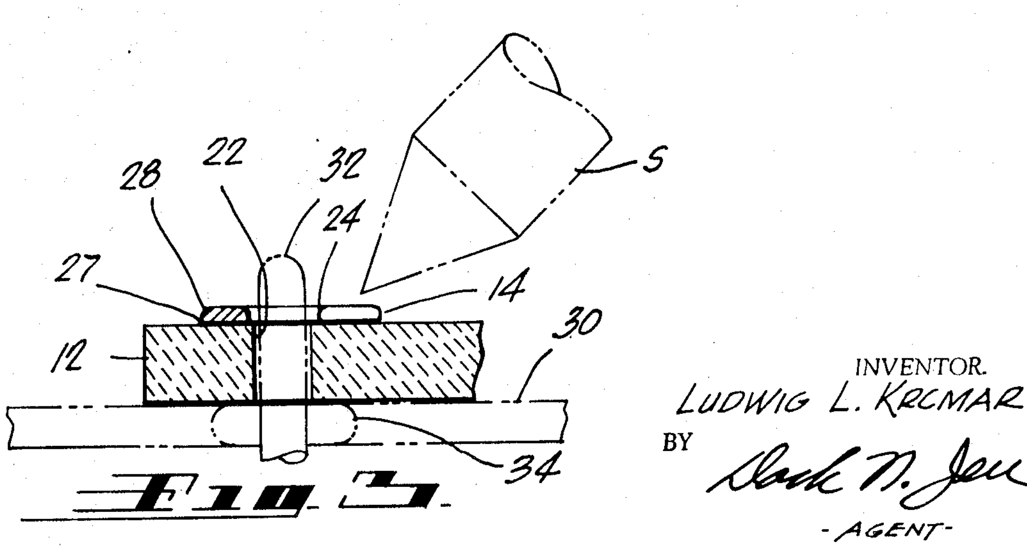
FIG. 3 is a sectional elevation view of the fragmentary substrate portion shown in FIG. 2, as taken along the line 3–3 indicated in the latter figure.

FIG. 3 is a sectional elevation view of the fragmentary substrate portion shown in FIG. 2, as taken along the line 3–3 indicated in the latter FIG. The solder-coated terminal pad 14 includes a printed terminal pad structure or configuration 27 fired on the substrate 12, and a solder coating 28 on the printed pad structure or configuration. The substrate 12 of the thick-film circuit board 10 (FIG. 1) is normally mounted to the base 30 of an encapsulating can having a closing cover lid (not shown). Terminal pins 32 are secured to the base 30 by, for example, glass beads 34. Each pin 32 passes through the pin and pad openings 22 and 24 as indicated in FIG. 3. A soldering iron S is used later on the solder coating 28 to melt the same so that it makes a good and firm bond with the terminal pin 32. The cover lid is then fastened to the base 30 when terminal pin bonding operations and other component connections have been completed.

Figure 4:
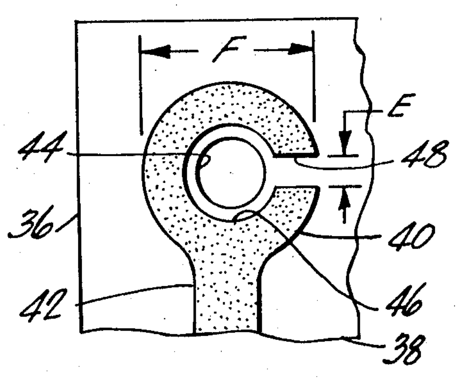
FIG. 4 is a fragmentary, top plan view of a printed circuit board showing a slightly different version of the structure of configuration of a terminal pad used on the board.

FIG. 4 is a fragmentary and enlarged top plan view of a portion of a printed circuit board 36 including an insulator board 38, solder-coated terminal pads 40 and solder-coated leads 42. The insulator board 38 has terminal pin openings 44 which are surrounded by respective terminal pads 40. The terminal pad 40 has a central opening 46 and a slot or gap 48 as illustrated. The terminal pad 40 has a generally circular outer periphery but otherwise is similar to the terminal pad 14 shown in FIG. 2. For a pin opening 44 and pad opening 46 of the same exemplary dimensions as those of the terminal pad 14, the slot 48 of the pad 40 has a dimension E of 0.015 inch and a pad diameter F of 0.100 inch, for example.

It is to be understood that the particular embodiments of this invention as described above and shown in the drawing are merely illustrative of, and not restrictive on, the broad invention and that I do not desire to be limited in my invention to the exact details of construction shown and described, for obvious modifications will occur to persons skilled in the art.

I claim:

1. A terminal pad structure for a perforated printed circuit substrate including a terminal pin opening therein, said pad structure comprising:

a printed circuit layer on a surface of said substrate, said circuit layer including a printed pad having a pad opening aligned with said terminal pin opening in said substrate; and a slot extending laterally and vertically through said printed pad and connecting said pad opening with said surface of said substrate surrounding said printed pad, said slot having a width which prevents said pin opening from being plugged during a subsequent solder application process.

2. The invention as defined in claim 1 including a coating of solder on the exposed surfaces of said printed circuit layer.

3. The invention as defined in claim 1 wherein said pad opening is larger than said pin opening whereby a relatively small spacing is provided between the peripheries of said pad and pin openings.

4. The invention as defined in claim 3 including a coating of solder on the exposed surfaces of said printed circuit layer.

5. The invention as defined in claim 1 wherein said slot extends in a generally radial direction from the center of said pad opening and is a gap of relatively uniform width.

6. The invention as defined in claim 5 including a coating of solder on the exposed surfaces of said printed circuit layer.